United States Patent [19]

Ketchledge

[11] 4,419,623
[45] Dec. 6, 1983

[54] REACTANCE METER

[75] Inventor: Raymond W. Ketchledge, Morristown, N.J.

[73] Assignee: Bell Telephone Laboratories, Incorporated, Murray Hill, N.J.

[21] Appl. No.: 327,925

[22] Filed: Dec. 7, 1981

[51] Int. Cl.³ ............................................. G01R 27/00
[52] U.S. Cl. .................................. 324/57 Q; 324/59; 324/60 R; 324/61 QS
[58] Field of Search ..................... 324/57 Q, 57 R, 59, 324/60 R, 61 QS

[56] References Cited

U.S. PATENT DOCUMENTS 2,602,838  7/1952  Boisblanc et al. ............... 324/57 R
3,225,298  12/1965 Cochran ....................... 324/57 R X
3,612,993  10/1971 Tims et al. ........................ 324/57 R
3,840,805  10/1974 Martyashin et al. ............. 324/57 Q
3,970,925  7/1976  Procter et al. ................... 324/57 Q

FOREIGN PATENT DOCUMENTS 55-40950  3/1980  Japan ................................ 324/60 R Primary Examiner—Stanley T. Krawczewicz
Attorney, Agent, or Firm—J. P. Kearns; H. L. Newman

[57] ABSTRACT

A circuit capable of measuring the value of an unknown reactance over a wide range of values resonates the unknown reactance with a known reactance value of opposite type by means of an operational amplifier. An adjustable feedback resistance connected between the output and input of the operational amplifier triggers the oscillation. The value of the unknown reactance is then readily computed from the resonant frequency and the known reactance value. In a further calculation the Q of the circuit can be determined from the feedback resistance value.

8 Claims, 3 Drawing Figures

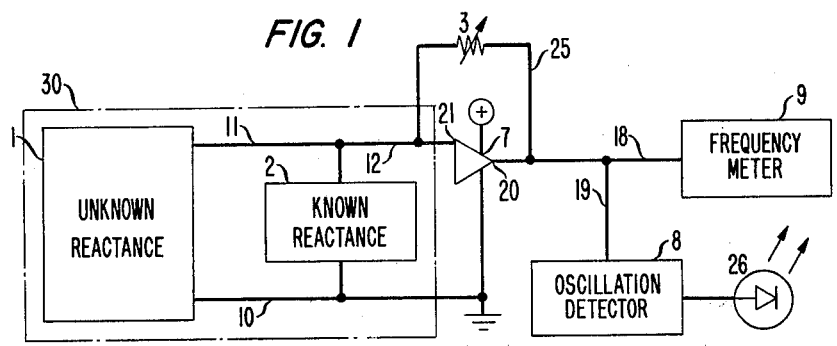
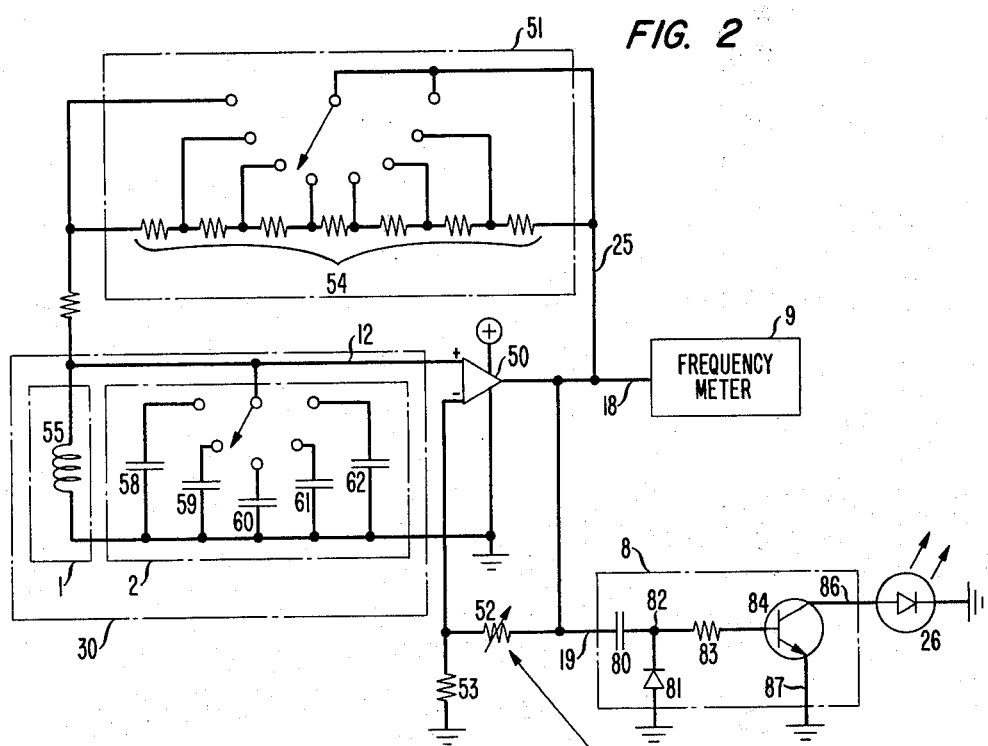
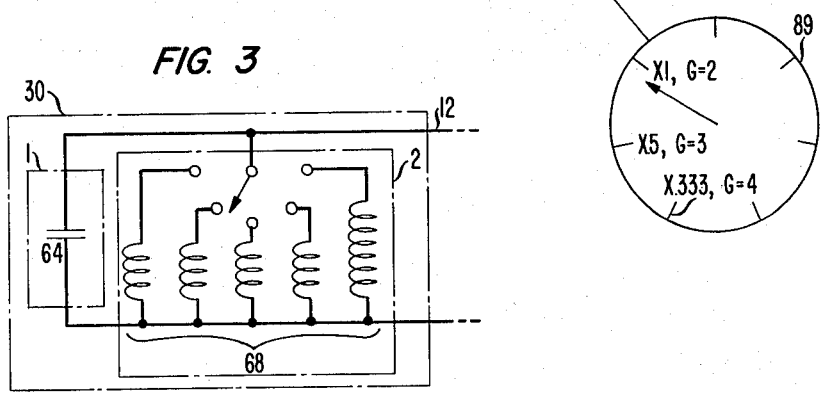

REACTANCE METER

FIELD OF THE INVENTION

This invention relates to apparatus and method for measuring the value of a reactance element.

BACKGROUND OF THE INVENTION

Bridge circuits have typically been employed to measure reactor values. (Hereinafter, the term "reactor value" will be taken to mean in a generic sense the amount of capacitance or the amount of inductance in a circuit element.) Bridges typically utilize in one of four arms a variable reactance that is adjusted until a null balance is achieved across the bridge. Two common measurement bridges are the Maxwell bridge either for comparing two inductances with each other or for comparing an inductance with a capacitance, and the Wien bridge for comparing two capacitances with each other. The balance equation for each of these bridges is independent of frequency.

The disadvantages of using these bridges, however, are that accurate results require a skilled operator and completion of a single measurement can require many minutes.

For measurement of small reactor values one can use a Q-meter employing a fixed frequency oscillator output applied to a series L-C circuit with either the capacitance or inductance as the unknown parameter. Current can be measured by a non-reactive hot wire ammeter. Knowing one reactor value and its resonant frequency when paralleled with the unknown reactance, the unknown reactor value can be computed. However, when a significant amount of resistance is present in the circuit, the total impedance at resonance may be only slightly different from that far from resonance and hence accurate measurement of the unknown value becomes difficult if not impossible.

Another reactor measuring device is taught by Procter et al. in their U.S. Pat. No. 3,970,925. Procter et al. utilize a variable frequency oscillator to produce a sinusoidal output which in turn is fed through a tank circuit which comprises reactive elements of known and unknown values. A phase detector measures the phase shift between the output voltage and current of the oscillator and supplies a phase shift signal specifying this information to a control circuit. The control circuit supplies a frequency control signal to adjust the frequency of the oscillator responsive to the phase shift signal in a direction tending to reduce the phase shift to zero or to some other predetermined value which indicates the resonance condition of the circuit.

It is necessary in the Procter et al. invention to compute the phase angle difference between the output voltage and current to determine the value of the unknown reactance element. Oftentimes a non-resonant phase must be utilized to determine if, for instance, a parallel circuit is employed (due to the fact that no current flows through the oscillator at resonance). This invention adjusts the frequency of oscillation through circuitry which comprises a phase detector and a control circuit which further comprises an amplifier and filter.

Accordingly, one of the objects of my invention is to provide a simple circuit for measuring the reactor value of an inductor or capacitor.

It is another object of my invention to provide a measuring device for a wide range of reactor values.

It is a further object of my invention to measure the quality factor of an unknown reactance element.

SUMMARY OF THE INVENTION

According to one embodiment of my invention, an unknown reactance element to be measured and a known reactance element of the opposite type constitute a parallel resonant tank circuit. This tank circuit in turn is connected to a positive input of an operational amplifier. A variable feedback resistance is connected from an output terminal to a positive input terminal of this amplifier. The variable resistance is adjusted to cancel out the non-reactive component of the impedance of the tank circuit and thus trigger the circuit into oscillation. Thereafter the reactor value of the unknown reactance element can be calculated from the frequency of oscillation, the known reactor value and the feedback resistance.

Similarly, the quality factor (Q) of the unknown reactance element can be determined from the newly acquired reactor value of that element, the frequency of oscillation of the tank circuit and the value of the feedback resistance.

This invention is applicable to the measurement of reactor values over a wide range.

BRIEF DESCRIPTION OF THE DRAWING

FIG. 1 is a generalized block diagram of the apparatus of this invention.

FIG. 2 is a block diagram of an embodiment of this invention showing an inductor as the unknown reactance element.

FIG. 3 is a block diagram of an alternative tank circuit showing a capacitor as the unknown reactance element.

DETAILED DESCRIPTION

It is well known to those skilled in the art that in a series or parallel circuit containing reactive elements of opposite types, one of unknown value but known type and another of both known value and type, resonance of the circuit can be achieved. The resonant frequency together with the value of the known reactance element allows the calculation of the unknown reactor value from the formula:

$$f_o = \frac{1}{2\pi (LC)^{\frac{1}{2}}}, \quad (1)$$

where $f_o$ is the frequency at resonance and L and C are the respective inductive and capacitive reactor values in the resonant circuit.

By straightforward rearrangement of terms $$LC = \frac{1}{(2\pi f_o)^2}, \quad (2)$$

that is, the product of the reactor values of the known and unknown reactance elements is proportional to the reciprocal of the square of the resonant frequency.

The reactor value of the unknown reactance is readily obtained from equation (2) by dividing the indicated result by the reactor value of the known reactance, keeping in mind the relationship among units of capacitance, inductance and frequency. For instance, where capacitance, inductance and frequency are measured respectively in microfarads, millihenries and megaHertz, a dimensional factor of $10^{-3}$ is required on the right-hand side of the equation. The quality factor Q of a parallel resonant circuit can be calculated from the resonant frequency $f_o$ of the circuit, the resistance R observed at resonance, and the reactor value X of either reactance element according to either of the following formulae:

$$Q = \frac{R}{X_L} = \frac{R}{2\pi f_o L} \text{ for an inductor of inductance } L, \tag{3}$$

where substantially all of the resistance is in the inductor and where R is the resistance of the circuit at resonance and $X_L$ is inductive reactance; or $$Q = \frac{R}{X_C} = 2\pi f_o CR \text{ for a capacitor} \tag{4}$$

of capacitance C, where substantially all the resistance is in the capacitor, and where $X_C$ is capacitive reactance.

This invention utilizes equation (2) in conjunction with either of equations (3) or (4) to find first the reactor value of an unknown reactance and then its quality factor (Q) in a novel way. This method requires fewer components than any in the prior art and additionally can be adapted to measure a wide range of values of reactance elements.

FIG. 1 is a generalized block diagram of the reactance measurement apparatus of this invention. In this apparatus unknown reactance element 1 is connected in parallel with a known reactance element 2 via leads 10 and 11 to form resonant tank circuit 30.

Unknown reactance element 1 must be opposite in type to known reactance element 2. That is to say, if the unknown element 1 is a capacitor then known element 2 is an inductor and vice versa. Tank circuit 30 in turn is connected via lead 12 to input terminal 21 of amplifier 7. Variable resistor 3 is a feedback resistor for amplifier 7 connected from its output terminal 20 over lead 25 to its input terminal 21. Output 20 of amplifier 7, in addition to the feedback resistance connection via lead 25, is connected to frequency meter 9 via lead 18 and to oscillation detector 8 via lead 19 to indicate the presence of oscillation. Oscillation detector 8 rectifies and amplifies the oscillation signal on lead 19 to cause LED 26 to glow when oscillation is present.

Those skilled in the art recognize that the combination of a positive feedback amplifier in circuit with a tank circuit can be used as an oscillator. In my invention this principle is used advantageously to find the reactor value of an unknown reactance element and its quality factor (Q). Thus, feedback resistor 3 is adjusted to cause and sustain oscillation. Where the oscillation occurs is the natural resonance point of tank circuit 30 because, as is well known, the resistance of resistor 3 in combination with the gain of amplifier 7 has effectively canceled the resistive component of the impedance (Z) of tank circuit 30. Thus, in FIG. 1 the point of oscillation can be determined by observation of LED 26 and the frequency of oscillation or resonant frequency can be read from frequency meter 9.

It should also be understood that known reactance 2 can be implemented by a plurality of selectable calibrated reactance elements to allow for a wider range of resonant frequencies.

FIG. 2 is an illustrative embodiment of my invention in block diagram form. This circuit comprises virtually the same elements as FIG. 1 except that operational amplifier (opamp) 50 with positive and negative inputs (as shown) replaces amplifier 7 of FIG. 1. Connected to opamp 50 are positive and negative variable feedback resistors 51 and 52, respectively. Feedback resistor 51 is shown as a selectable ladder of discrete resistors 54. Also connected to the negative input of opamp 50 is resistor 53 which acts with continuously variable resistor 52 as a voltage divider. In this embodiment tank circuit 30 comprises a discrete inductor 55 as unknown reactance 1 and a selectable calibrated ladder of capacitors 58, 59, 60, 61 and 62 as known reactance 2.

In the embodiment of FIG. 2 oscillation detector 8 further comprises blocking capacitor 80, one terminal of which is connected by way of lead 19 to receive the signal from the output of opamp 50; diode 81 whose cathode is connected to the other terminal of capacitor 80 at junction 82 and whose anode is connected to ground; resistor 83, one of whose terminals is connected to junction 82; transistor 84, whose base is connected to the other terminal of resistor 83 and whose emitter 87 is connected to ground; and LED 26 which is connected between the collector 86 of transistor 84 and ground.

All D.C. voltages from opamp 50 are blocked from detector 8 by capacitor 80. Diode 81 through its operation prevents negative voltage swings of the oscillation from appearing at the base of transistor 84 through resistor 83. Therefore, resistor 83 receives a positive D.C. current from junction 82. This current flows into the base of transistor 84. Those skilled in the art recognize that the current flowing out of the collector 86 of transistor 84 will be several times greater than the current flowing into its base. This amplified current from collector 85 thereafter causes LED 26 to glow as an indication that oscillation has occurred.

In the embodiment of FIG. 2 negative feedback resistor 52 in conjunction with resistor 53 provides the gain adjustment for opamp 50. It is well known to those skilled in the art that operational amplifiers typically have very large internal gains on the order of 100,000 or more. It is also well known that to obtain wide bandwidth the loop gain of the amplifier must be low. Finally, it is known that negative feedback lowers the loop gain of the amplifier, thereby widening the bandwidth. It is therefore important that the bandwidth of the amplifier be broad in order to accommodate a wide range of resonant frequencies.

It can be shown that internal gain G is given by:

$$G = \frac{R_{52} + R_{53}}{R_{53}} \tag{5}$$

If, for example, $R_{52} = R_{53}$, $G = 2$. Therefore, the gain of opamp 50 by proper manipulation of resistors 52 and 53 can be maintained at some small number to widen the bandwidth of the amplifier.

It is further known that the loop gain (L.G.) of an operational amplifier used in an oscillator circuit is equal to 1 at the resonant frequency. Therefore, $$\frac{R_{51} + Z}{Z} = \frac{R_{52} + R_{53}}{R_{53}} \tag{6}$$

where $R_{51}$ is the magnitude of feedback resistor 51 and Z is the magnitude of the impedance of the tank circuit at resonance. It follows that variable resistances $R_{51}$ and $R_{52}$ are directly related, i.e., if $R_{52}$ is decreased then $R_{51}$ must be decreased and vice versa.

In this embodiment two criteria must be met to insure accurate measurement:

(1) internal gain (G) must be kept at a relatively low value (approximately 2-10) and (2) loop gain (L.G.) must be kept at unity to satisfy the resonance condition.

In addition, the selectability of calibrated capacitors 58, 59, 60, 61, and 62 increases flexibility in resonant frequency determination.

To determine Q of the inductance, the reactance X of the inductance must first be obtained. It is known by those skilled in the art that high Q capacitors are readily available so that all resistance can be assumed to be associated with the inductor. It is also known that the reactance $X_L$ of the inductor is $2\pi f_o L$ where $f_o$ is resonant frequency and L is the inductance value.

The magnitude of the impedance Z of a tank circuit is the quotient of the product and sum of the impedances of the inductive and capacitive branches. Assuming that the non-reactive components are of negligible value, the impedance at resonance is purely resistive and reduces to the product of the Q factor from equation (3) and the reactance of either branch, i.e., $Z=QX$. Solving for Q, one obtains $$Q=(Z/X) \qquad (7)$$

at the parallel or anti-resonant condition.

At resonance in a parallel tank circuit overall impedance Z is purely resistive and of value R. Thus, $$Q=(R/X). \qquad (8)$$

Note that from equations (5) and (6) the feedback resistance is $$R_{51}=Z(G-1). \qquad (9)$$

Equations (5), (7) and (9) can be combined in an obvious way to solve for Q; thus $$Q = \frac{R_{51} R_{53}}{R_{52}} \cdot \frac{1}{X}. \qquad (10)$$

Therefore, the gain G of amplifier 50 is in effect a multiplier of impedance. Thus, by dividing the positive feedback resistance $R_{51}$ by $(G-1)$, the impedance Z of inductor 1 can be calculated. Thus, the variable resistor 52 can be calibrated as a multiplier of resistance 51. Looking at dial 89 which is a representation of the calibration of $R_{52}$, the point on resistor 52 at which $G=2$ is marked X1 (times one); where $G=3$ is marked X0.5 (times one-half), and $G=4$ is marked X0.333 (times one-third). In general as many points as desired can be marked in the form $1/(G-1)$.

To make measurements with this embodiment proceed as follows. Initially one of the discrete capacitors is switched into place to provide the tank circuit. Thereafter the variable feedback resistor 52 is set at the X1 position on the dial corresponding to the point that the gain equals 2. Then selectable resistances 54 are switched in sequence into the circuit until oscillation occurs. Finally to determine the exact point of oscillation the variable resistor 52 is readjusted to determine the exact point of oscillation by observation of LED 26. This corresponds to the anti-resonance or parallel resonance frequency of the tank circuit. Finally, when $R_{52}$ is adjusted to just start oscillation, the product of $R_{51}$ and the scale marking on $R_{52}$ which adjusts G gives Z of equation (7) or R of equation (8).

Preferably the input impedance of opamp 50 should be chosen to be high compared to Z and the output impedance, low compared to the minimum value of $R_{51}$. Without these precautions these impedances may cause measurement error, particularly in the determination of Q. Emitter followers can be used ahead of and after the opamp 50 to increase the input impedance and to decrease the output impedance. If the amplifier includes a field effect insulated gate transistor in its input, the input impedance can be made very high.

These embodiments are illustrative of implementations of this invention, but this invention is in no way restricted to these configurations. The tank circuit 30 of FIG. 3 can be substituted for tank circuit 30 in FIG. 2. Then the unknown reactance 1 can comprise discrete capacitor 64 while the known reactance 2 can comprise a plurality of selectable calibrated inductors 68. Tank circuits 30 in FIGS. 2 and 3 are full electrical equivalents of each other. This invention is not restricted to the specific amplifiers or variable feedback resistances that are shown in FIG. 2.

By manual observation and recordation of the values of the known impedance and frequency the unknown reactance can be determined from a reactance chart. The quality factor can be determined in a similar manner. Alternatively, a calculator or computer can be used to convert $R_{51}$, G and $f_o$ into L or C and Q. This invention finds particular use in measurements of the values of different reactance elements. Through the proper implementation of this invention a broad bandwidth, low gain amplifier can be utilized to determine a wide range of reactance values. It has been found, for example, that this invention can measure inductance values from a tenth of a microhenry to hundreds of henries and similarly can measure capacitances from tenths of picofarads to thousands of microfarads. In addition, this circuit utilizes few circuit elements and is readily adaptable to integrated circuit technology. It makes use of a frequency meter, an instrument in widespread use.

While this invention has been disclosed by means of a specific illustrative embodiment, the principles thereof are capable of a wide range of modification by those skilld in the art within the scope of the following claims.

What is claimed is:

1. A circuit for determining the value of an unknown reactance comprising:

known reactance means of one type;

unknown reactance means of another type;

means for connecting said known reactance means in circuit with said unknown reactance means for forming a tank circuit;

amplifying means with an input and output;

adjustable resistance means connected in positive feedback relationship between the output and input of said amplifying means, the adjustable resistance means for canceling the nonreactive component of the tank circuit in such a way to permit oscillation thereof; and means connected to the output of said amplifying means for measuring the frequency of oscillation of said tank circuit;

the product of the reactor values of said known and unknown reactance means being inversely proportional to the square of said frequency of oscillation.

2. The circuit of claim 1 in which said unknown reactance is inductive and said known reactance comprises a plurality of selectable calibrated capacitors.

3. The circuit of claim 1 in which said unknown reactance is capacitive and said known reactance comprises a plurality of selectable calibrated inductors.

4. The circuit of claim 1 in which said amplifying means is an operational amplifier including positive and negative input terminals and an output terminal;

said adjustable resistance means is connected between the positive input and output terminals of said amplifier for canceling the effect of the nonreactive component of the impedance in said tank circuit to allow the oscillation thereof;

further adjustable feedback resistance means is connected between the negative input and output terminals of said amplifier; and fixed resistance means is connected from the negative input terminal of said amplifier to a ground reference point to form a voltage divider;

said further adjustable feedback resistance means and said fixed resistance means providing for gain adjustment of said operational amplifier.

5. A circuit for determining the quality factor (Q) of an unknown reactor of one reactance type comprising:

a tank circuit including with said unknown reactor a known reactor of the opposite reactance type;

amplifying means connected to said tank circuit in such a way as to cancel the effect of the nonreactive component therein and cause the oscillation at a resonant frequency;

a first adjustable resistance connected in positive feedback relationship between input and output terminals of said amplifying means whose setting at the resonant frequency of said tank circuit is proportional to the nonreactive component thereof;

a second adjustable resistance connected to negative feedback relationship between input and output terminals of said amplifying means;

a fixed resistance to ground from the point of connection of said second adjustable resistance to said amplifying means; and means for measuring the resonant frequency of said tank circuit;

the product of the reactor values of the known and unknown reactors being equal to the reciprocal of the square of the angular frequency of resonance, thus:

$$LC = \frac{10^{-3}}{(2\pi f_o)^2},$$

where
L = inductance in millihenries of one reactor,
C = capacitance in microfarads of the other reactor,
$\pi$ = ratio of the circumference to the diameter of a circle, and
$f_o$ = resonant frequency of oscillation in megaHertz; and the quality factor Q being equal to the quotient of the nonreactive component R of said tank circuit at resonance to the reactance X of either branch thereof, thus:

$$Q = R/X = R/(2\pi f_o L) = 2\pi f_o CR.$$

where R is measured in ohms proportional to the quotient of the product of the settings of said first and second adjustable resistances and the value of said fixed resistance to ground.

6. A method for determining the value of an unknown reactance utilizing a circuit comprising; a known reactance, amplifying means whose input is connected to the known reactance, and a variable resistance connected in positive feedback relationship with the amplifying means, the method comprising the steps of;
connecting the known reactance to the unknown reactance to form a tank circuit;
adjusting the variable feedback resistance until oscillation occurs, the oscillation occurring at the resonant frequency of the tank circuit;
measuring the resonant frequency of the tank circuit; and
determining the unknown reactance value from the resonant frequency of the tank circuit and the known reactance value.

7. A method for determining the value of an unknown reactance utilizing a circuit comprising; a known reactance, amplifying means whose input is connected to the known reactance, and a first and second variable resistance connected in positive and negative feedback relationship respectively with the amplifying means, the method comprising the steps of:

connecting the known reactance to the unknown reactance to form a tank circuit;
adjusting the first variable resistance until oscillation occurs;
adjusting the second variable resistance to find the exact point of oscillation, the point of oscillation being the resonant frequency of the tank circuit;
measuring the resonant frequency of the tank circuit; and
determining the unknown reactance value from the resonant frequency and the known reactance.

8. A method for determining the quality factor (Q) of an unknown reactance utilizing a circuit comprising; a known reactance, amplifying means whose input is connected to the known reactance, and a first and second variable resistance connected in positive and negative feedback relationship respectively with the amplifying means, the method comprising the steps of;

connecting the known reactance to the unknown reactance to form a tank circuit;
adjusting the first variable resistance until oscillation occurs;
adjusting the second variable resistance to find an exact point of oscillation, the point of oscillation being the resonant frequency of the tank circuit;
measuring the resonant frequency of the tank circuit;
determining the unkown reactance value from the resonant frequency and the known reactance; and
determining the quality factor (Q) of the unknown reactance from the known reactance value, the unknown reactance value and the resonant frequency, the quality factor (Q) being equal to a quotient of a nonreactive component of the tank circuit to a reactive component of either branch thereof at the resonant frequency.

* * * * *